(12) United States Patent
Carman

(10) Patent No.: US 8,411,524 B2
(45) Date of Patent: *Apr. 2, 2013

(54) TECHNIQUES FOR REFRESHING A SEMICONDUCTOR MEMORY DEVICE

(75) Inventor: Eric Carman, Cernex (FR)

(73) Assignee: Micron Technology, Inc., Boise, ID (US)

( * ) Notice: Subject to any disclaimer, the term of this patent is extended or adjusted under 35 U.S.C. 154(b) by 85 days.

This patent is subject to a terminal disclaimer.

(21) Appl. No.: 12/985,191

(22) Filed: Jan. 5, 2011

(65) Prior Publication Data

US 2011/0273947 A1    Nov. 10, 2011

Related U.S. Application Data

(60) Provisional application No. 61/332,037, filed on May 6, 2010.

(51) Int. Cl.
*G11C 7/00* (2006.01)
(52) U.S. Cl. .................. 365/222; 365/187
(58) Field of Classification Search .............. 365/159, 365/187, 187 X, 222 O, 222
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — VanThu Nguyen
(74) *Attorney, Agent, or Firm* — Wilmer Cutler Pickering Hale and Dorr LLP

(57) ABSTRACT

Techniques for refreshing a semiconductor memory device are disclosed. In one particular exemplary embodiment, the techniques may be realized as a method for refreshing a semiconductor memory device may include applying a plurality of voltage potentials to a memory cell in an array of memory cells. Applying a plurality of voltage potentials to the memory cell may include applying a first voltage potential to a first region of the memory cell via a respective source line of the array. Applying a plurality of voltage potentials to the memory cells may also include applying a second voltage potential to a second region of the memory cell via a respective local bit line and a respective selection transistor of the array. Applying a plurality of voltage potentials to the memory cells may further include applying a third voltage potential to a respective word line of the array, wherein the word line may be spaced apart from and capacitively to a body region of the memory cell that may be electrically floating and disposed between the first region and the second region. Applying a plurality of voltage potentials to the memory cells may further include applying a fourth voltage potential to a third region of the memory cell via a respective carrier injection line of the array.

19 Claims, 7 Drawing Sheets

U.S. PATENT DOCUMENTS

| | | |
|---|---|---|
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes et al. |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Chang et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,967,358 B2 * | 11/2005 | Nemati et al. ................. 257/133 |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,209,384 B1 * | 4/2007 | Kim ................. 365/175 |

| | | |
|---|---|---|
| 7,230,846 B2 | 6/2007 | Keshavarzi et al. |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller et al. |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Raghavan et al. |
| 7,606,066 B2 | 10/2009 | Okhonin et al. |
| 7,696,032 B2 | 4/2010 | Kim et al. |
| 8,139,418 B2 * | 3/2012 | Carman ................. 365/185.18 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2006/0279985 A1 | 12/2006 | Keshavarzi et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0211535 A1 * | 9/2007 | Kim ................. 365/185.21 |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0080244 A1 | 3/2009 | Carman et al. |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2010/0271858 A1 * | 10/2010 | Carman et al. ................. 365/72 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |

| | | |
|---|---|---|
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | 55-038664 | 3/1980 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor Ram (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pp.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, Same.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T-DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. on El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI Flash Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two-Transistor Floating Body/Gate Cell for Low Power Nanoscale Embedded DRAM, 2008, IEEE Trans. on El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1T Bulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology (CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories—Embedded Tutorial: The New Memory Revolution, New Drives Circuits and Systems, ICCAD 2008, Nov. 2008.

Nemati, Fully Planar 0.562 µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor Ram (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-Dram Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. on El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns. 64-Mb DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International Soi Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRMA Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

International search report and Written Opinion mailed on Nov. 28, 2011, for International Application No. PCT/US11/034924 filed May 3, 2011 (6 pages).

International search report and Written Opinion mailed on Dec. 19, 2011, for International Application No. PCT/US11/034937 filed May 3, 2011 (6 pages).

* cited by examiner

TECHNIQUES FOR REFRESHING A SEMICONDUCTOR MEMORY DEVICE

CROSS-REFERENCE TO RELATED APPLICATIONS

This patent application claims priority to U.S. Provisional Patent Application No. 61/332,037, filed May 6, 2010, which is hereby incorporated by reference herein in its entirety.

FIELD OF THE DISCLOSURE

The present disclosure relates generally to semiconductor memory devices and, more particularly, to techniques for refreshing a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be read by applying bias signals to a source/drain region and a gate of the memory transistor. As such, a conventional reading technique may involve sensing an amount of current provided/generated by/in the electrically floating body region of the memory cell in response to the application of the source/drain region and gate bias signals to determine a data state of the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and the gate of the memory transistor. As such, a conventional writing technique may result in an increase/decrease of majority charge carriers in the electrically floating body region of the memory cell which, in turn, determines the data state of the memory cell. Such an excess of majority charge carriers may result from channel impact ionization, band-to-band tunneling (gate-induced drain leakage "GIDL"), or direct injection. Majority charge carriers may be removed via drain region hole removal, source region hole removal, or drain and source region hole removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell, which, in turn, may result in an inaccurate determination of the data state of the memory cell. Furthermore, in the event that a bias signal having a voltage potential that is below a threshold voltage potential of the memory transistor is applied to the gate of the memory transistor, a channel of minority charge carriers beneath the gate may be eliminated. However, some of the minority charge carriers may remain "trapped" in interface defects. Some of the trapped minority charge carriers may combine with majority charge carriers, which may be attracted to the gate as a result of the applied bias signal. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the data state of the memory cell.

In view of the foregoing, it may be understood that there may be significant problems and shortcomings associated with conventional techniques for operating a semiconductor memory device.

SUMMARY OF THE DISCLOSURE

Techniques for refreshing a semiconductor memory device are disclosed. In one particular exemplary embodiment, the techniques may be realized as a method for refreshing a semiconductor memory device may comprise applying a plurality of voltage potentials to a memory cell in an array of memory cells. Applying a plurality of voltage potentials to the memory cell may comprise applying a first voltage potential to a first region of the memory cell via a respective source line of the array. Applying a plurality of voltage potentials to the memory cells may comprise applying a second voltage potential to a second region of the memory cell via a respective local bit line and a respective selection transistor of the array. Applying a plurality of voltage potentials to the memory cells may further comprise applying a third voltage potential to a respective word line of the array, wherein the word line may be spaced apart from and capacitively to a body region of the memory cell that may be electrically floating and disposed between the first region and the second region. Applying a plurality of voltage potentials to the memory cells may further comprise applying a fourth voltage potential to a third region of the memory cell via a respective carrier injection line of the array.

In accordance with other aspects of this particular exemplary embodiment, the respective local bit line may be coupled to a multiplexer.

In accordance with further aspects of this particular exemplary embodiment, the multiplexer may be coupled to a global bit line.

In accordance with additional aspects of this particular exemplary embodiment, the multiplexer may comprise at least one masking transistor coupled to the respective local bit line.

In accordance with yet another aspect of this particular exemplary embodiment, the multiplexer may further comprise at least one hold transistor coupled to the respective local bit line.

In accordance with other aspects of this particular exemplary embodiment, the respective selection transistor may be coupled to the at least one mask transistor and the at least one hold transistor.

In accordance with further aspects of this particular exemplary embodiment, applying a plurality of voltage potentials to the memory cells may further comprise maintaining the first voltage potential applied to the first region at a constant level via the respective source line during the refresh of the semiconductor memory device.

In accordance with additional aspects of this particular exemplary embodiment, applying a plurality of voltage potentials to the memory cells may further comprise applying a selection control signal to the respective selection transistor to activate the respective selection transistor.

In accordance with yet another aspect of this particular exemplary embodiment, applying a plurality of voltage potentials to the memory cells may further comprise increasing the second voltage potential applied to the respective source line from the second voltage potential applied to the respective source line during a hold operation via the activated respective selection transistor.

In accordance with other aspects of this particular exemplary embodiment, applying a plurality of voltage potentials to the memory cells may further comprise increasing the fourth voltage potential applied to the respective carrier injection line from the fourth voltage potential applied to the respective carrier injection line during a hold operation.

In accordance with further aspects of this particular exemplary embodiment, applying a plurality of voltage potentials to the memory cells may further comprise applying decoupling control signals to the respective selection transistor to deactivate the respective selection transistor.

In accordance with additional aspects of this particular exemplary embodiment, the respective local bit line may be electrically floating after the respective selection transistor is deactivated.

In accordance with yet another aspect of this particular exemplary embodiment, applying a plurality of voltage potentials to the memory cells may further comprise increasing the third voltage potential applied to the respective word line from the third voltage potential applied to the respective word line during a hold operation in order to perform a read operation.

In accordance with other aspects of this particular exemplary embodiment, the increase in the third voltage potential may activate the memory cell to decrease the second voltage potential applied to the respective local bit line.

In accordance with further aspects of this particular exemplary embodiment, applying a plurality of voltage potentials to the memory cells may further comprise decreasing the third voltage potential applied to the respective word line from the third voltage potential applied to the respective word line during a write logic low operation to perform a write logic high operation.

In accordance with additional aspects of this particular exemplary embodiment, the third voltage potential applied to the respective word line during the write logic high operation may be higher than the third voltage potential applied to the respective word line during a hold operation.

In accordance with yet another aspect of this particular exemplary embodiment, applying a plurality of voltage potentials to the memory cells may further comprise applying a coupling control signals to the respective selection transistor to activate the respective selection transistor in order to perform an end to a write logic high operation.

In accordance with other aspects of this particular exemplary embodiment, applying a plurality of voltage potentials to the memory cells may further comprise discharging the second voltage potential applied to the respective local bit line to forward bias a junction between the second region and the third region.

In accordance with further aspects of this particular exemplary embodiment, applying a plurality of voltage potentials to the memory cells may further comprise decreasing the fourth voltage potential applied to the respective carrier injection line from the fourth voltage potential applied to the respective carrier injection line during a write logic high operation to perform a hold operation.

In accordance with additional aspects of this particular exemplary embodiment, applying a plurality of voltage potentials to the memory cells may further comprise decreasing the second voltage potential applied to the respective local bit line from the second voltage potential applied to the respective local bit line during a write logic high operation to perform a hold operation.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
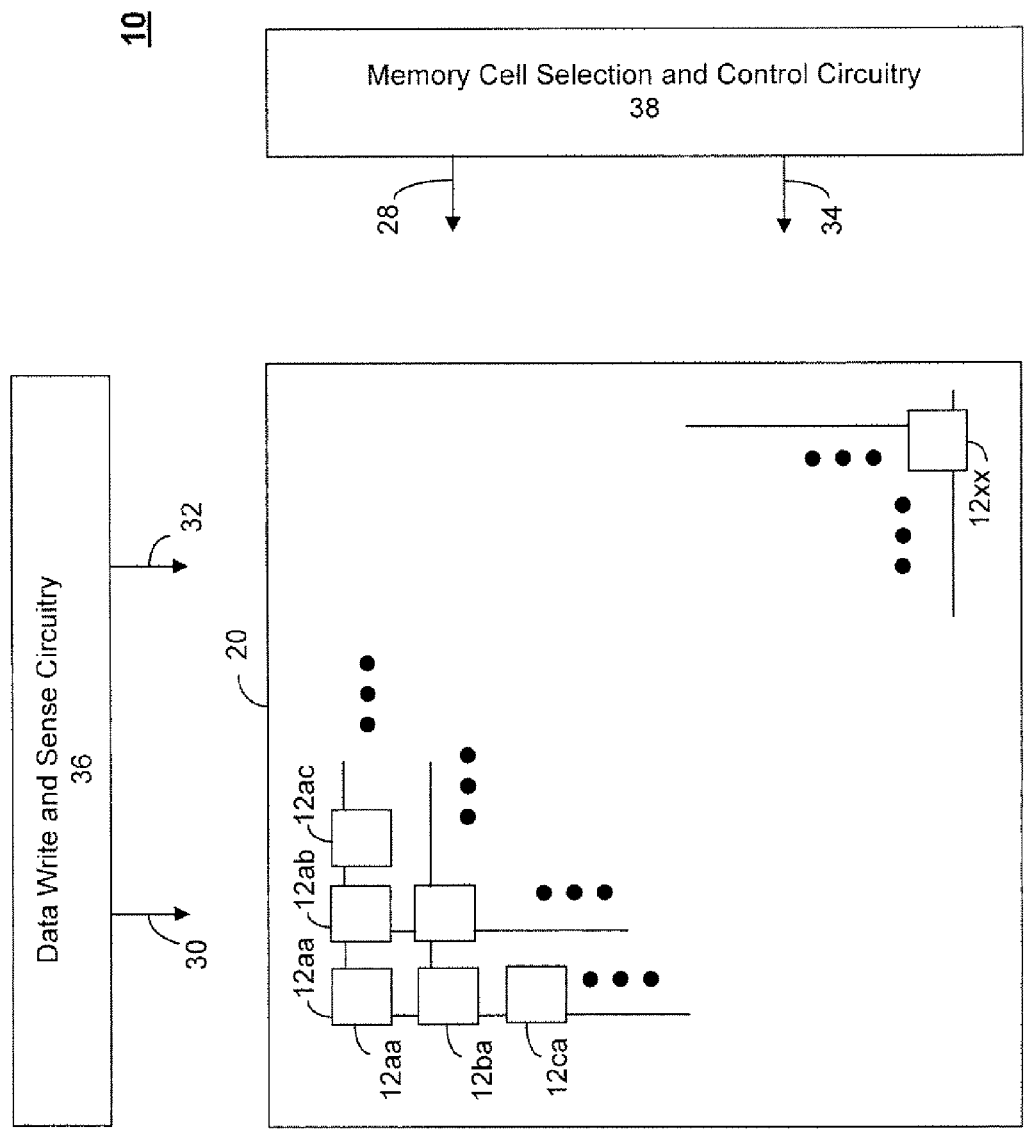
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a bit line (CN) 30 and a source line (EN) 32. It may be appreciated that the bit line (CN) 30 and the source line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple to a data sense amplifier circuit to at least one bit line (CN) 30. In an exemplary embodiment, the multiplexer may couple a plurality of bit lines (CN) 30 to a data sense amplifier circuit.

Each data sense amplifier circuit may employ voltage and/or current sensing circuitry and/or techniques. In an exemplary embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry thereof) to select and/or enable one or more predetermined memory cells 12. Notably, all such control/selection techniques, and circuitry thereof, whether now known or later developed, are intended to fall within the scope of the present disclosure.

In an exemplary embodiment, the semiconductor memory device 10 may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state logic high (binary "1" data state)). The semiconductor memory device 10 may also implement a one step write operation whereby selected memory cells 12 in a row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
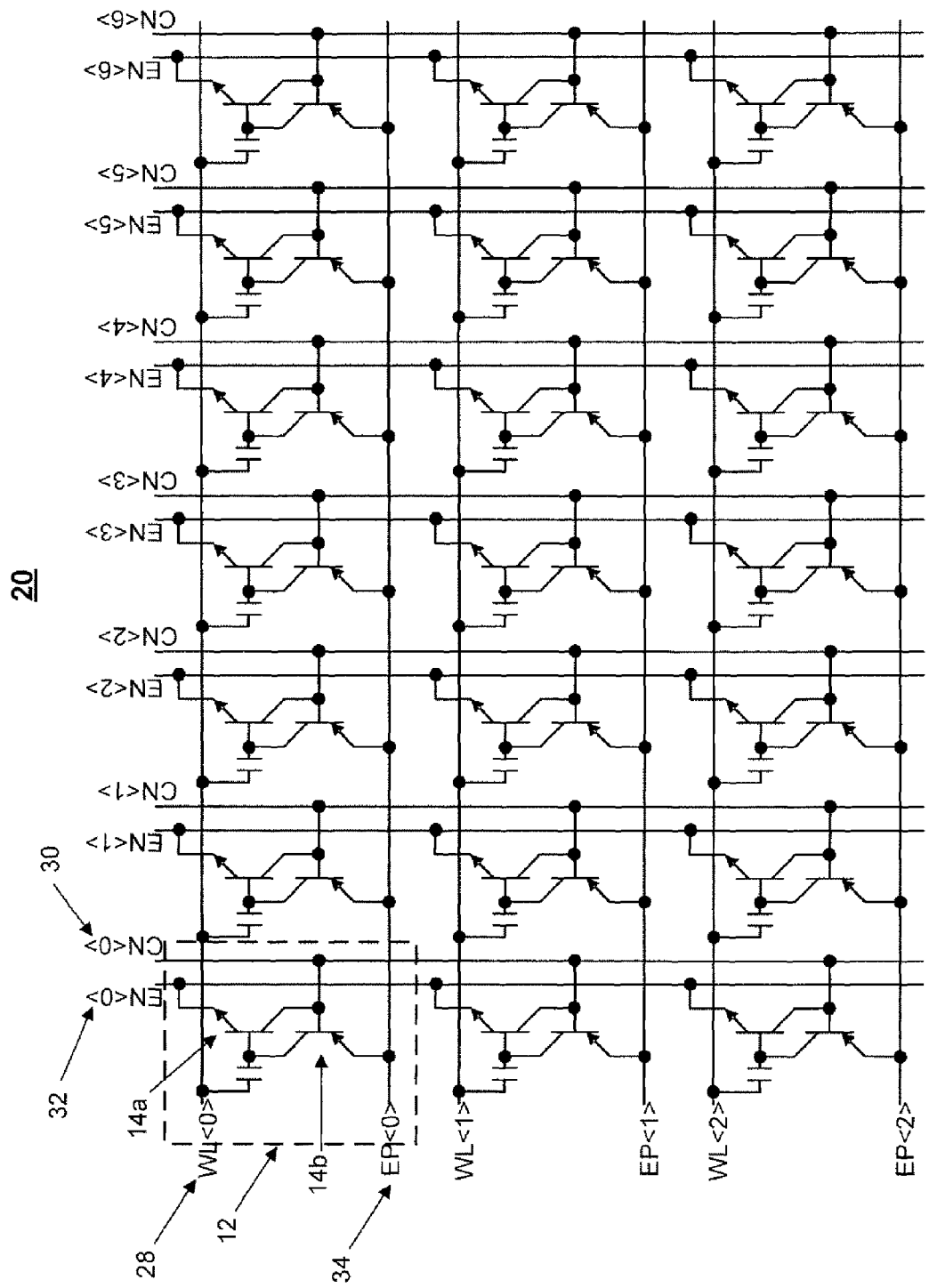
FIG. 2 shows a schematic diagram of at least a portion of a memory cell array having a plurality of memory cells in accordance with an embodiment of the present disclosure.

Referring to FIG. 2, there is shown a memory cell array 20 having a plurality of memory cells 12 in accordance with an embodiment of the present disclosure. Each of the memory cells may comprise a first bipolar transistor 14a and a second bipolar transistor 14b coupled to each other. For example, the first bipolar transistor 14a and/or the second bipolar transistor 14b may be an NPN bipolar transistor or a PNP bipolar transistor. As illustrated in FIG. 2, the first bipolar transistor 14a may be an NPN bipolar transistor and the second bipolar transistor 14b may be a PNP bipolar transistor. In another exemplary embodiment, the first memory transistor 14a may be a PNP bipolar transistor and the second memory transistor 14b may be an NPN bipolar transistor. In another exemplary embodiment, each of the memory cells 12 may comprise a first field effect transistor (FET) 14a and a second bipolar transistor 14b. For example, the first field effect transistor (FET) 14a may be a metal-oxide semiconductor field effect transistor (MOSFET) or junction field effect transistor (JFET). The memory cells 12 may be coupled to a respective word line (WL) 28, a respective bit line (CN) 30, a respective source line (EN) 32, and/or a respective carrier injection line (EP) 34. Data may be written to or read from a selected memory cell 12 by applying suitable control signals to a selected word line (WL) 28, a selected bit line (CN) 30, a selected source line (EN) 32, and/or a selected carrier injection line (EP) 34. In an exemplary embodiment, the word line (WL) 28 may extend horizontally parallel to the carrier injection line (EP) 34. In another exemplary embodiment, the bit line (CN) 30 may extend vertically parallel to the source line (EN) 32.

In an exemplary embodiment, one or more respective bit line (CN) 30 may be coupled to a data sense amplifier circuit of the data write and sense circuitry 36. For example, one or more control signals may be applied to one or more selected memory cells 12 via a selected word line (WL) 28, a selected bit line (CN) 30, a selected source line (EN) 32, and/or a selected carrier injection line (EP) 34. A voltage potential and/or a current may be generated by the one or more selected memory cells 12 and outputted to the data sense amplifier circuit of the data write and sense circuitry 36 via a corresponding bit line (CN) 30.

Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from and/or written to the memory cell 12 via the bit line (CN) 30, then the bit line (CN) 30 may be coupled to the data sense amplifier circuit of the data write and sense circuitry 36 while the source line (EN) 32 may be separately controlled via a voltage/current source (e.g., a voltage/current driver) of the data write and sense circuitry 36. In an exemplary embodiment, the data sense amplifier circuit of the data write and sense circuitry 36 and the voltage/current source of the data write and sense circuitry 36 may be configured on opposite sides of the memory cell array 20. In another exemplary embodiment, the data write and sense circuitry 36 may include a plurality of data sense amplifier circuits configured on opposite sides of the memory cell array 20.

In the event that the source line (EN) 32 is coupled to the data sense amplifier circuit of the data write and sense circuitry 36, a voltage potential and/or current generated by the one or more selected memory cells 12 may be outputted to the data sense amplifier circuit of the data write and sense circuitry 36 via the corresponding source line (EN) 32. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. For example, the bit line (CN) 30 and the source line (EN) 32 may be coupled to disparate subcircuits (e.g., drivers and/or sense amplifiers) of the data write and sense circuitry 36 configured on opposite sides of the memory cell array 20. In an exemplary embodiment, the bit line (CN) 30 may be coupled to a driver and/or a sense amplifier circuit of the data write and sense circuitry 36, while the source line (EN) 32 may be coupled to a driver and/or a sense amplifier circuit of the data write and sense circuitry 36. Also, the driver and/or the data sense amplifier circuit coupled to the bit line (CN) 30 and the driver and/or the data sense amplifier circuit coupled to the source line (EN) 32 may be configured on opposite sides of the memory cell array 20. By reading a data state via the source line (EN) 32 and writing a data state via the bit line (CN) 30, the resistance to the memory cell 12 may be reduced because the source line (EN) 32 and the bit line (CN) 30 are driven from opposite sides of the memory cell array 20.

Figure 3:
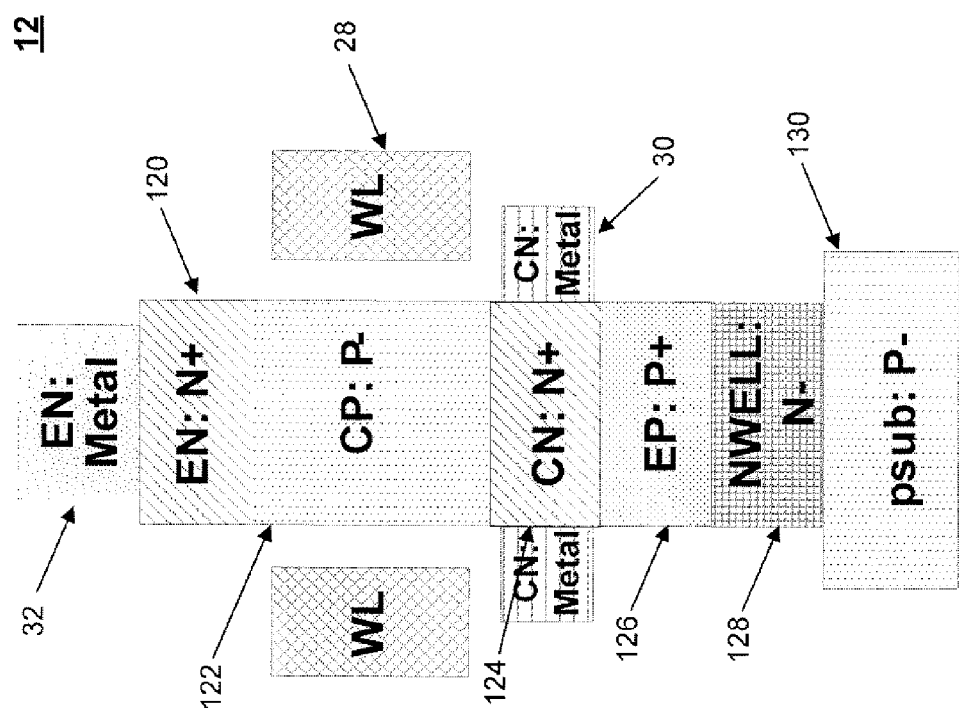
FIG. 3 shows a cross-sectional view of the memory cell array shown in FIG. 2 in accordance with an embodiment of the present disclosure.

Referring to FIG. 3, there is shown a cross-sectional view of the memory cell 12 shown in FIG. 1 in accordance with an embodiment of the present disclosure. As discussed above, the memory cell 12 may comprise two bipolar transistors. In an exemplary embodiment, the first bipolar transistor 14a may be a NPN bipolar transistor and the second bipolar transistor 14b may be a PNP bipolar transistor. In an exemplary embodiment, the first bipolar transistor 14a and the second bipolar transistor 14b may share one or more common regions. The first NPN bipolar transistor 14a may comprise an N+ emitter region 120, a P− base region 122, and an N+ collector region 124. The second PNP bipolar transistor 14b may comprise a P− collector region 122, an N+ base region 124, and a P+ emitter region 126. The N+ region 120, the P− region 122, the N+ region 124, and/or the P+ region 126 may be disposed in sequential contiguous relationship within a pillar or fin configuration that may extend vertically or perpendicularly to a plane defined by an N-well region 128 and/or a P− substrate 130. In an exemplary embodiment, the P− region 122 may be an electrically floating body region of the memory cell 12 configured to accumulate/store charges that may be spaced apart from and capacitively coupled to the word line (WL) 28.

The N+ emitter region 120 of the first bipolar transistor 14a may be coupled to the source line (EN) 32 formed of a metal layer. Also, the P− base region 122 of the first bipolar transistor 14a and/or the P− collector region 122 of the second bipolar transistor 14b may be capacitively coupled to the word line (WL) 28 formed of a metal layer. In another exemplary embodiment, the N+ region 124 of the memory cell 12 may be coupled to a bit line (CN) 30 formed of a metal layer. The bit line (CN) 30 may circumferentially surround the N+ region 124 of the memory cell 12. In another exemplary embodiment, the bit line (CN) 30 may be coupled to the N+ region 124 on one or more side regions (e.g., one side region or two side regions) of the N+ region 124. The bit line (CN) 30 may reduce a disturbance to the memory cell 12. In particular, the bit line (CN) 30 may be formed of a metal layer and therefore may reduce a hole disturbance to the memory cell 12. The bit line (CN) 30 may extend horizontally in parallel to the source line (EN) 32 coupling to a plurality of memory cells 12 (e.g., a column of memory cells 12). For example, the bit line (CN) 30 and the source line (EN) 32 may be arranged in different planes and configured to be parallel to each other. The source line (EN) 32 may provide an alternative means for addressing or accessing the memory cell 12. The memory cell 12 may be addressed or accessed via either the bit line (CN) 30 or the source line (EN) 32, or the combination of the bit line (CN) 30 and the source line (EN) 32.

Figure 4:
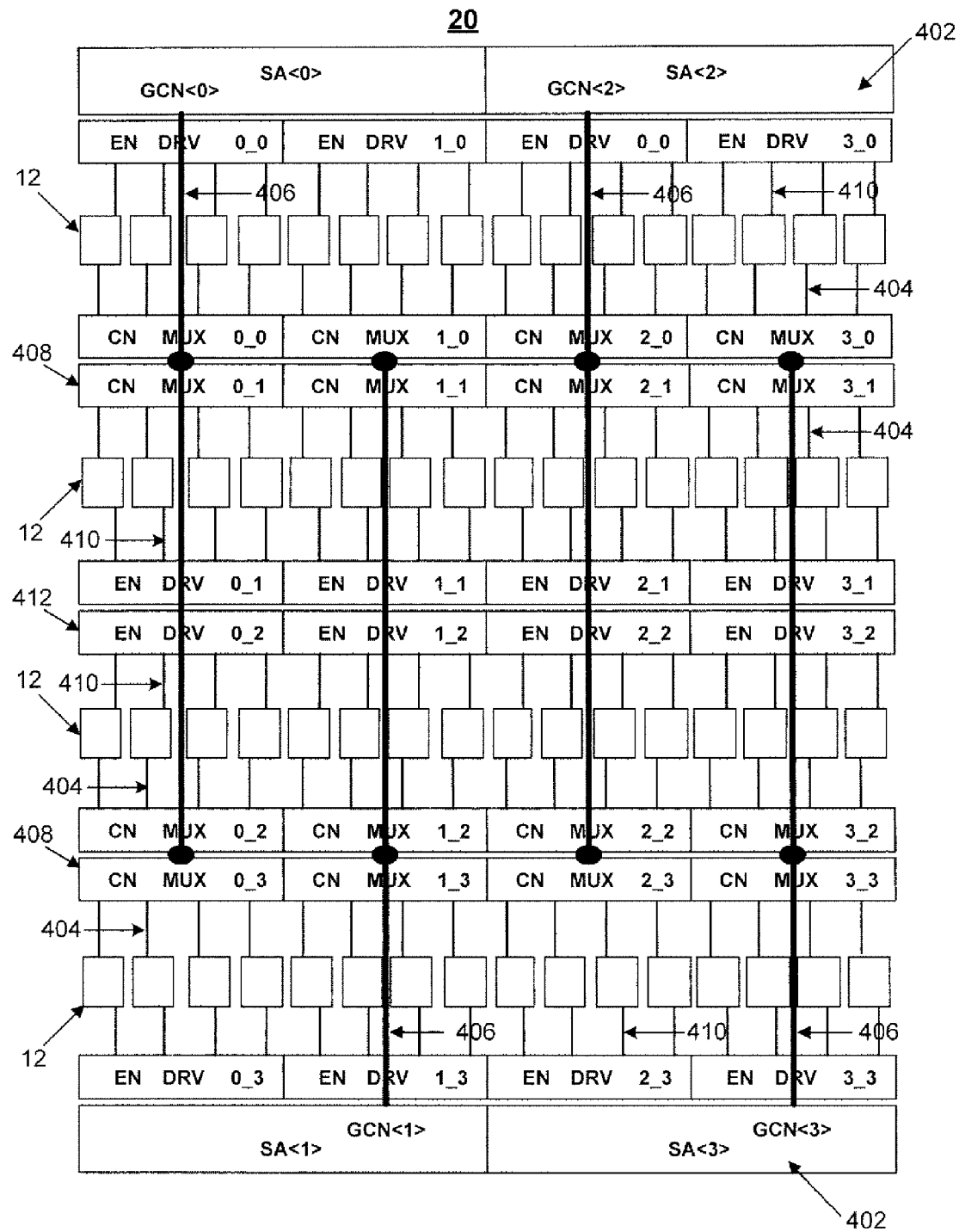
FIG. 4 shows a schematic diagram of at least a portion of a memory cell array having a plurality of memory cells coupled to a plurality of sense amplifier circuits via a hierarchical bit line configuration in accordance with another embodiment of the present disclosure.

Referring to FIG. 4, there is shown a schematic diagram of at least a portion of a memory cell array 20 having a plurality of memory cells 12 coupled to a plurality of sense amplifier circuits 402 via a hierarchical bit line configuration in accordance with another embodiment of the present disclosure. Each of the memory cells 12 of the memory cell array 20 may be coupled to a data sense amplifier circuit 402 via the hierarchical bit line configuration. The hierarchical bit line configuration may include a local bit line (LCN) 404 (e.g., the bit line (CN) 30) coupled directly to a respective memory cell 12. Each local bit line (LCN) 404 may be coupled to a global bit line (GCN) 406 via a multiplexer (MUX) 408. The hierarchical bit line configuration may reduce bit line capacitance and resistance and may result in less attenuation of signals during various operations on the memory cell 12. Also, the reduction of the bit line capacitance may result in lower power consumption on a selected column of memory cells 12. Further, the hierarchical bit line configuration may reduce an amount of disturbance on unselected memory cells 12 because only unselected local bit lines (LCN) 404 adjacent to a selected local bit line (LCN) 404 may experience disturbance. Additionally, power consumption may be reduced by applying masking control signals only to unselected local bit lines (LCNs) 404 that are adjacent to a selected local bit line (LCN) 404.

The hierarchical bit line configuration may include a plurality of local bit lines (LCNs) 404 coupled to a respective multiplexer (MUX) 408. In an exemplary embodiment, four local bit lines (LCNs) 404 may be coupled to a respective multiplexer (MUX) 408. It may be appreciated by one skilled in the art that the number of local bit lines (LCNs) 404 coupled to a respective multiplexer (MUX) 408 may vary. For example, eight local bit lines (LCNs) 404, sixteen local bit lines (LCNs) 404, thirty-two local bit lines (LCNs) 404, sixty-four local bit lines (LCNs) 404 etc., may be coupled to a respective multiplexer (MUX) 408.

The hierarchical bit line configuration may include a global bit line (GCN) 406 coupled to a plurality of multiplexers (MUXs) 408. In an exemplary embodiment, a global bit line (GCN) 406 may be coupled to four multiplexers (MUXs) 408. It may be appreciated by one skilled in the art that the number of multiplexers (MUXs) 408 coupled to a global bit line (GCN) 406 may vary. For example, eight multiplexers (MUXs) 408, sixteen multiplexers (MUXs) 408, thirty-two multiplexers (MUXs) 408, sixty-four multiplexers (MUXs) 408 etc., may be coupled to the global bit line (GCN) 406. Each global bit line (GCN) 406 may be coupled to a plurality of local bit lines (LCNs) 404 via a plurality of multiplexers (MUXs) 408. In an exemplary embodiment, each global bit line (GCN) 406 may be coupled to sixteen local bit lines (LCNs) 404 via four multiplexers (MUXs) 408.

Each memory cell 12 may be biased by a respective source line driver 412. Each source line driver 412 may be coupled to a plurality of memory cells 12 via a plurality of local source lines (LEN) 410. In an exemplary embodiment, each source line driver 412 may be coupled to four memory cells 12. It may be appreciated by one skilled in the art that the number of memory cells 12 coupled to a source line driver 412 may vary. For example, eight local source lines (LENS) 410, sixteen local source lines (LENs) 410, thirty-two local source lines (LENs) 410, sixty-four local source lines (LENs) 410 etc., may be coupled to a source line driver 412. In an exemplary embodiment, the number of memory cells 12 coupled to a source line driver 412 may be equal to the number of memory cells 12 coupled to a multiplexer (MUX) 408.

Figure 5:
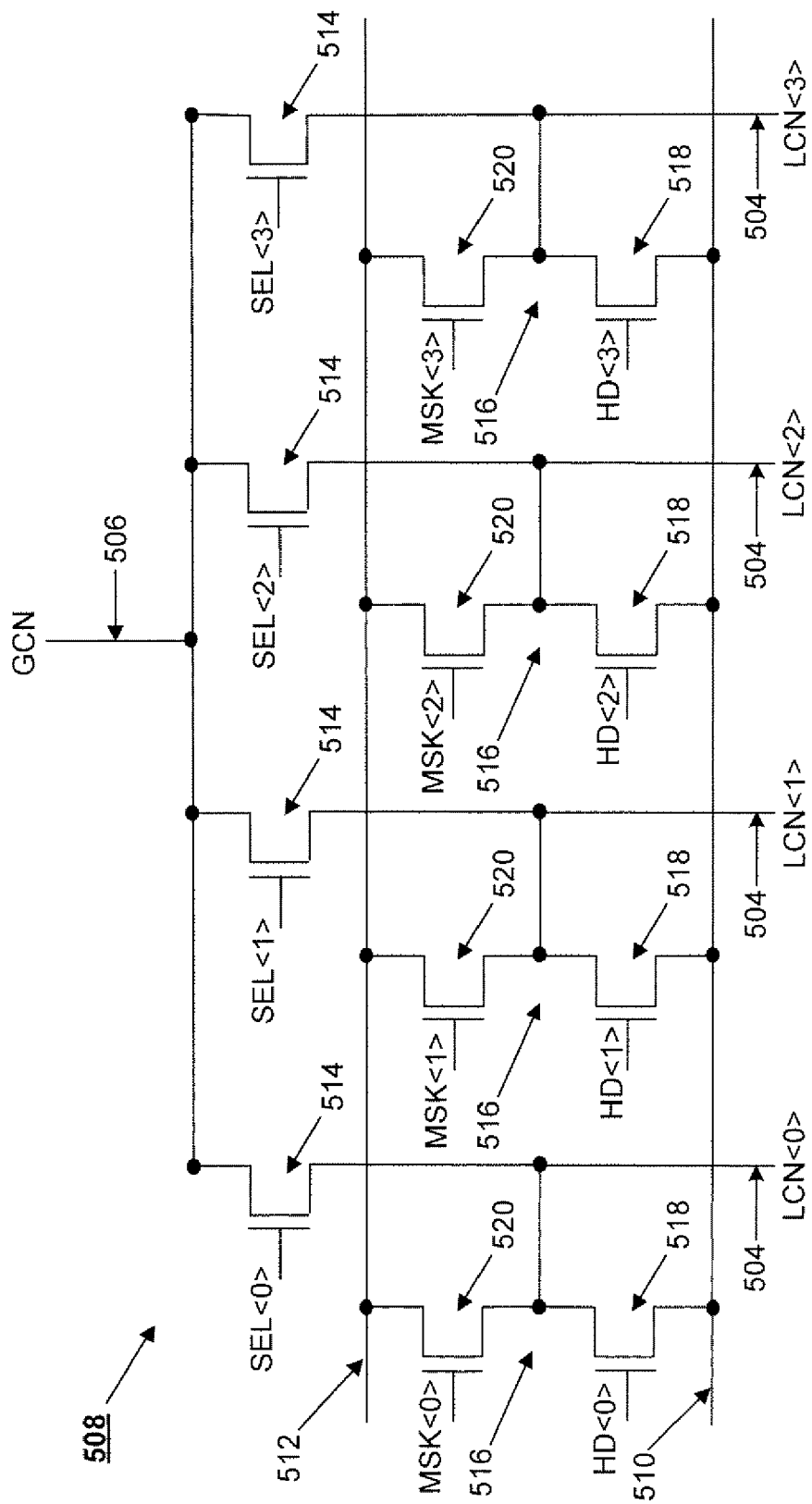
FIG. 5 shows a schematic diagram of a multiplexer for a hierarchical bit line configuration in accordance with an embodiment of the present disclosure.

Referring to FIG. 5, there is shown a schematic diagram of a multiplexer 508 for a hierarchical bit line configuration in accordance with an embodiment of the present disclosure. As shown in FIG. 5, a global bit line (GCN) 506 may be coupled to a plurality of local bit lines (LCNs) 504 via the multiplexer 508. In an exemplary embodiment, the multiplexer 508 may include a plurality of selection transistors (SELs) 514 coupled to the plurality of local bit lines (LCN) 504 and the global bit line (GCN) 506. Each selection transistor 514 may be, for example, an N-type or a P-type bipolar junction transistor or an N-Channel or a P-Channel metal-oxide semiconductor field effect transistor (MOSFET). Each of the plurality of selection transistors (SELs) 514 may be biased to selectively couple a local bit line (LCN) 504 to the global bit line (GCN) 506. In an exemplary embodiment, selection transistor (SEL<0>) 504 may be biased to couple the local bit line (LCN<0>) 504 to the global bit line (GCN) 506, while the selection transistors (SEL<1>, SEL<2>, and SEL<3>) may be biased to decouple the local bit lines (LCN<1>, LCN<2>, and LCN<3>) 504 from the global bit line (GCN) 506.

The multiplexer 508 may also include a plurality of biasing transistor pairs 516. Each biasing transistor pair 516 may include, for example, an N-type or a P-type bipolar junction transistor and/or an N-Channel or a P-Channel metal-oxide semiconductor field effect transistor (MOSFET). Each biasing transistor pair 516 may be coupled to a global hold line (GHL) 510 and/or a global mask line (GML) 512. Each biasing transistor pair 516 may include a hold transistor (HD) 518 and a mask transistor (MSK) 520. In an exemplary embodiment, each hold transistor (HD) 518 may be coupled to the global hold line (GHL) 510 and each mask transistor (MSK) 520 may be coupled to the global mask line (GML) 512. Control signals may be applied to the gates of the hold transistors (HD) 518 to bias the hold transistors (HD) 518 in order to apply a holding voltage potential to a memory cell 12 during a hold operation via the local bit line (LCN) 504. For example, when control signals are applied to the gates of the hold transistors (HD) 518, the control signals may cause the plurality of hold transistors (HD<0>, HD<1>, HD<2>, and HD<3>) 518 to assume an "ON" state. Subsequently, the plurality of hold transistors (HD<0>, HD<1>, HD<2>, and HD<3>) 518 may output a holding voltage potential to a corresponding plurality of memory cells 12 via the local bit lines (LCN<0>, LCN<1>, LCN<2>, and LCN<3>) 504.

Also, control signals may be applied to the gates of the mask transistors (MSK) 520 to bias the mask transistors (MSK) 520 in order to apply a masking voltage potential to a memory cell 12 during a read and/or write operation via the local bit line (LCN) 504. For example, when control signals are applied to the gates of the mask transistors (MSK) 520, the control signals may cause the plurality of mask transistors (MSK<0>, MSK<1>, MSK<2>, and/or MSK<3>) 520 associated with unselected memory cells 12 to assume an "ON" state. Subsequently, the plurality of mask transistors (MSK<0>, MSK<1>, MSK<2>, and/or MSK<3>) 518 may output a masking voltage potential to a corresponding plurality of unselected memory cells 12 via the local bit lines (LCN<0>, LCN<1>, LCN<2>, and/or LCN<3>) 504 associated with the unselected memory cells 12.

Figure 6:
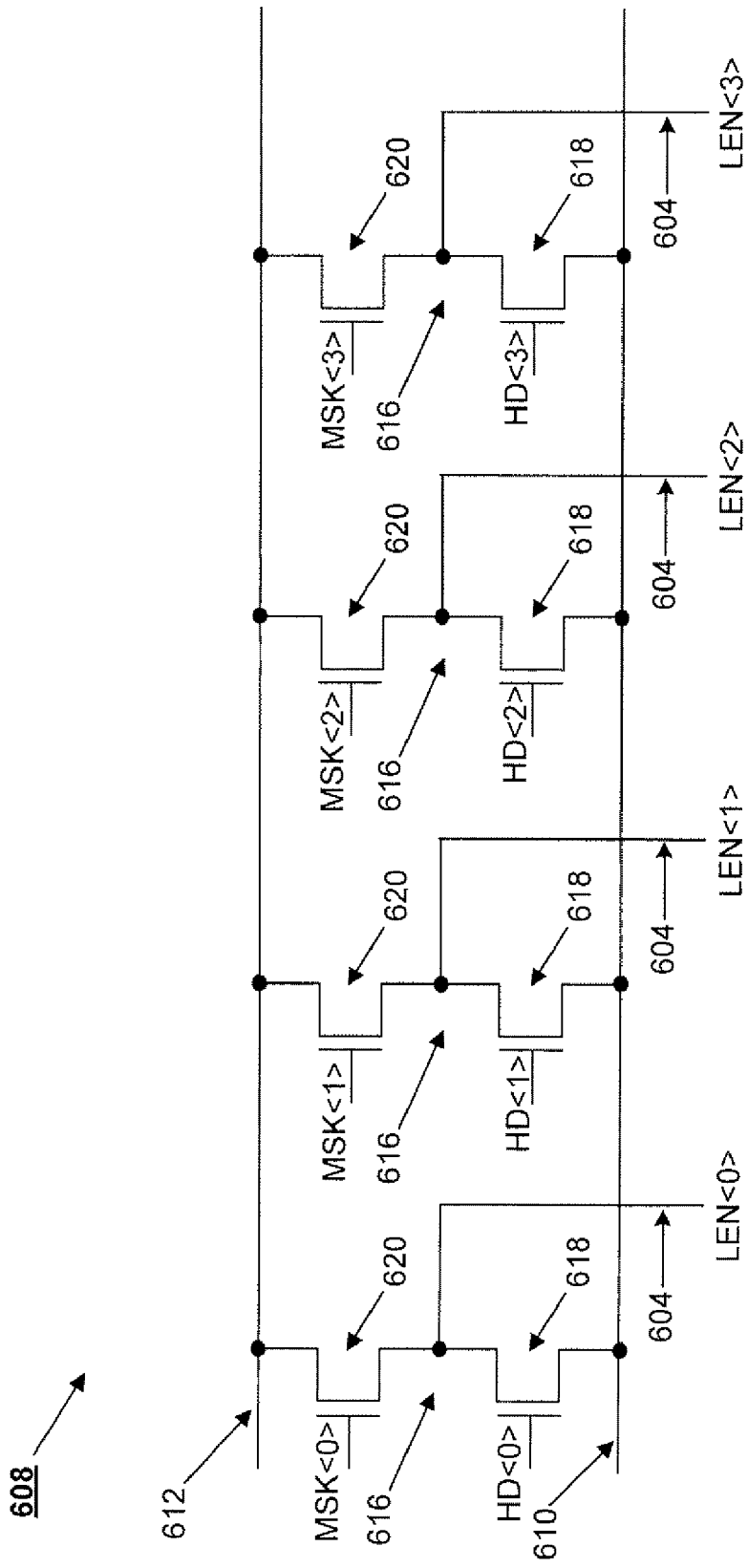
FIG. 6 shows a schematic diagram of a source line driver for a hierarchical bit line configuration in accordance with an embodiment of the present disclosure.

Referring to FIG. 6, there is shown a schematic diagram of a source line driver 608 for a hierarchical bit line configuration in accordance with an embodiment of the present disclosure. The source line driver 608 may include a plurality of biasing transistor pairs 616. Each biasing transistor pair 616 may include, for example, an N-type or a P-type bipolar junction transistor and/or an N-Channel or a P-Channel metal-oxide semiconductor field effect transistor (MOSFET). Each biasing transistor pair 616 may be coupled to a global hold line (GHL) 610 and/or a global mask line (GML) 612. Each biasing transistor pair 616 may include a hold transistor (HD) 618 and a mask transistor (MSK) 620. In an exemplary embodiment, each hold transistor (HD) 618 may be coupled to the global hold line (GHL) 610 and each mask transistor (MSK) 620 may be coupled to the global mask line (GML) 612. Control signals may be applied to the gates of the hold transistors (HD) 618 to bias the hold transistors (HD) 618 in order to apply a holding voltage potential to memory cells 12 during a hold operation via local source lines (LEN) 604. For example, when control signals are applied to the gates of the hold transistors (HD) 618, the control signals may cause the plurality of hold transistors (HD<0>, HD<1>, HD<2>, and HD<3>) 618 to assume an "ON" state. Subsequently, the plurality of hold transistors (HD<0>, HD<1>, HD<2>, and HD<3>) 618 may output a holding voltage potential to a corresponding plurality of memory cells 12 via the local source lines (LEN<0>, LEN<1>, LEN<2>, and LEN<3>) 604.

Also, control signals may be applied to the gates of the mask transistors (MSK) 620 to bias the mask transistors (MSK) 620 in order to apply a masking voltage potential to memory cells 12 during a read and/or write operation via local source lines (LEN) 604. For example, when control signals are applied to the gates of the mask transistors (MSK) 620, the control signals may cause the plurality of mask transistors (MSK<0>, MSK<1>, MSK<2>, and/or MSK<3>) 620 associated with unselected memory cells 12 to assume an "ON" state. Subsequently, the plurality of mask transistors (MSK<0>, MSK<1>, MSK<2>, and/or MSK<3>) 618 may output a masking voltage potential to a corresponding plurality of unselected memory cells 12 via the local source lines (LEN<0>, LEN<1>, LEN<2>, and/or LEN<3>) 604 associated with the unselected memory cells 12.

Figure 7:
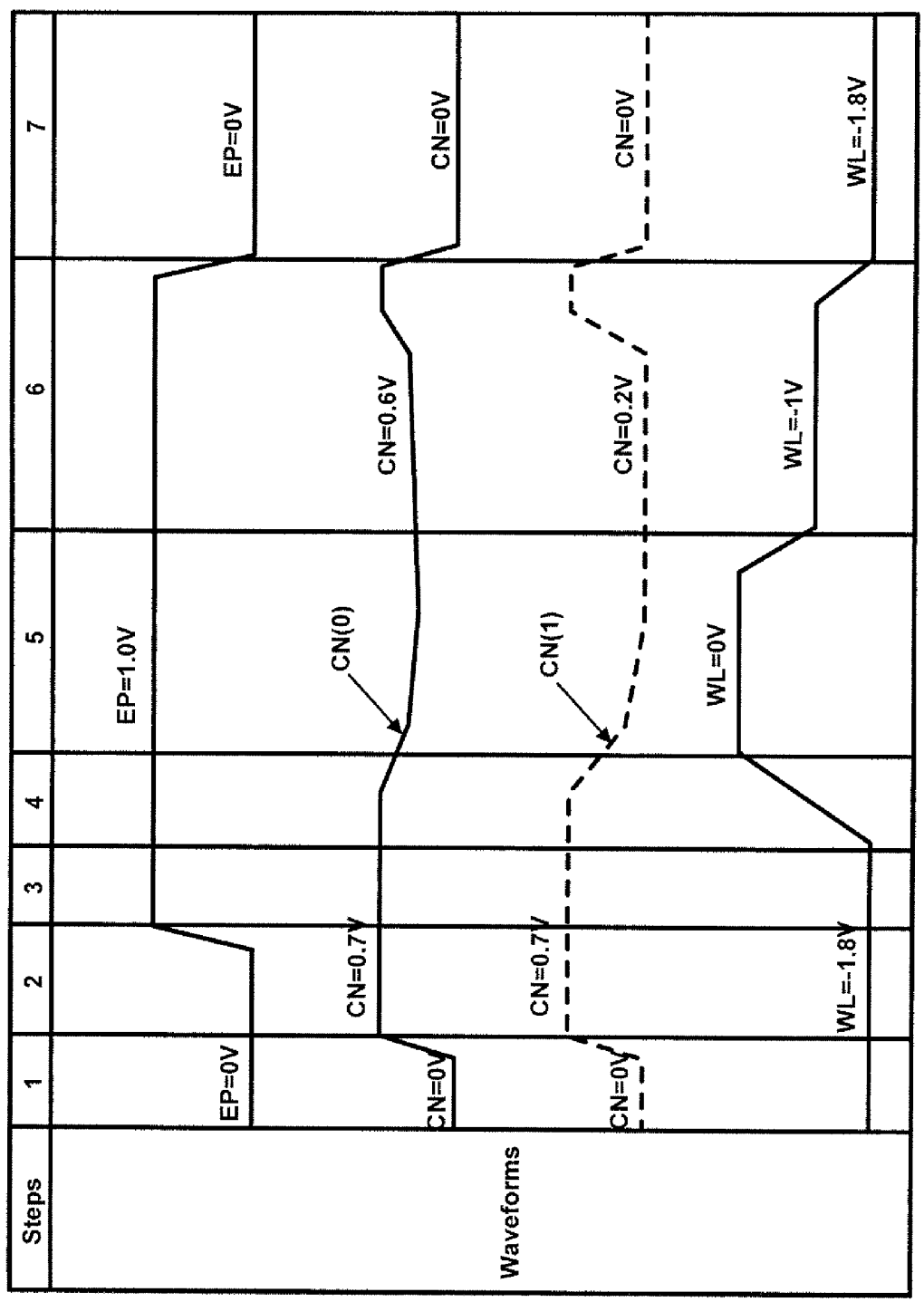
FIG. 7 shows control signal voltage waveforms for performing a refresh operation in accordance with an embodiment of the present disclosure.

Referring to FIG. 7, there are shown control signal voltage waveforms for performing refresh operation in accordance with an embodiment of the present disclosure. For example, the refresh operation may include one or more steps. The refresh operation may reduce an amount of power consumption because a read operation may not be performed (e.g., not activating data sense amplifier circuitry). Also, the refresh operation may reduce an amount of power consumption by simultaneously refreshing all memory cells 12 that are coupled to selected local bit lines (LCNs) 30 and that are coupled to a selected word line (WL) 28. Further, the refresh operation may reduce an amount of power consumption because the voltage potential applied to the source line (EN) 32 may remain constant during the entire refresh operation. Furthermore, by maintaining the voltage potential applied to the source lines (EN) 32 constant during the entire refresh operation, an amount of disturbance on the memory cells 12 may be reduced.

The refresh operation may include control signals configured to perform the one or more steps. Prior to performing a refresh operation, the control signals may be configured to perform a hold operation in order to maintain a data state (e.g., a logic high (binary "1" data state) or a logic low (binary "0" data state)) stored in the memory cell 12. In particular, the control signals may be configured to perform a hold operation in order to maximize a retention time of a data state (e.g., a logic low (binary "0" data state) and/or a logic high (binary "1" data state)) stored in the memory cell 12. Also, the control signals for the hold operation may be configured to eliminate or reduce activities or field (e.g., electrical fields between junctions which may lead to leakage of charges) within the memory cell 12. In an exemplary embodiment, during a hold operation, a negative voltage potential may be applied to the word line (WL) 28 that may be capacitively coupled to the P− region 122 of the memory cell 12, while the voltage potential applied to other regions (e.g., the N+ region 120, the N+ region 124, and/or the P+ region 126) may be maintained at 0V. For example, the negative voltage potential applied to the word line (WL) 28 (e.g., capacitively coupled to the P− region 122 of the memory cell 12) may be −1.8V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a first step of a refresh operation may include control signals to perform a preparation to start operation where the control signals may be applied to a memory cell 12 in order to prepare the memory cell 12 for one or more subsequent steps. For example, precharge controls signals may be applied to one or more selected local bit lines (LCNs) 30 to a predetermined voltage potential. The precharge control signals may be applied to the one or more selected local bit lines (LCNs) 30 via the multiplexer (MUX) 408. Selection control signals may be applied to one or more selection transistors (SELs) 514 to activate the one or more selection transistors (SELs) 514. The selection control signals may turn the one or more selection transistors (SELs) 514 to an "ON" state in order to couple the precharge control signal to the one or more corresponding local bit lines (LCNs) 30. In an exemplary embodiment, the precharge control signal may precharge the one or more local bit lines (LCNs) 30 to 0.7V.

The second step of the refresh operation may include control signals to apply to one or more memory cells 12 to perform a preparation to start operation where the control signals may be applied to a memory cell 12. The control signals may be applied to the P+ region 126 of the memory cell 12 via the carrier injection line (EP) 34. The control signals may apply a predetermined voltage potential to the P+ region 126 of the memory cell 12 via the carrier injection line (EP) 34. In an exemplary embodiment, the control signals may apply approximately 1.0V to 1.2V to the P+ region 126 of the memory cell 12 via the carrier injection line (EP) 34. The control signals applied to the P+ region 126 of the memory cell 12 will not cause the second bipolar transistor 14b to turn to an "ON" state. In an exemplary embodiment, the second step of the refresh operation may be performed simultaneously as the first step of the refresh operation. In another exemplary embodiment, the second step of the refresh operation may be performed after the first step of the refresh operation.

The third step of the refresh operation may include control signals to perform a preparation to start operation where the control signals may be applied to a memory cell 12. For example, after precharging the one or more local bit lines (LCNs) 30 to a predetermined voltage potential, decoupling control signals may be applied to the one or more selection transistors (SELs) 514 and turn the one or more selection transistors (SELs) 514 to an "OFF" state. In another exemplary embodiment, after precharging the one or more local bit lines (LCNs) 30 to a predetermined voltage potential, the selection control signals may be withdrawn from the one or more selection transistors (SELs) 514 in order to turn the one or more selection transistors (SELs) 514 to an "OFF" state. The one or more turned "OFF" selection transistors (SELs) 514 may decouple the one or more local bit lines (LCNs) 30 from the precharge control signals. In an exemplary embodiment, the one or more local bit lines (LCNs) 30 may be electrically floating.

The fourth step of the refresh operation may include control signals configured to perform a read operation. The read operation may include control signals configured to perform one or more write operations to one or more selected memory cells 12 of one or more selected rows of the memory cell array 20. For example, the read operation may be performed on one or more selected memory cells 12 and one or more selected rows of the memory cell array 20. For example, an increase in the voltage potential applied to the word line (WL) 28 (e.g., capacitively coupled to the P− region 122) may be higher than a voltage potential applied to the local bit line (LCN) 30 and/or the source line (EN) 32 by a predetermined voltage potential. The predetermined voltage potential may be a threshold voltage potential or forward bias voltage potential of the first bipolar transistor 14a and/or the second bipolar transistor 14b. For example, the predetermined voltage potential may be approximately 0.7V.

In an exemplary embodiment, a voltage potential applied to the word line (WL) 28 (e.g., capacitively coupled to the P− region 122) may be raised to 0V from −1.8V. In the event that a logic high (e.g., binary "1" data state) is stored in the memory cell 12, the first bipolar transistor 14a may be turned to an "ON" state. For example, the junction between the N+ region 120 and the P− region 122 may be forward biased and the junction between the P− region 122 and the N+ region 124 may be reverse biased and the first bipolar transistor 14a may be turned to an "ON" state. When the first bipolar transistor 14a is turned to an "ON" state, the N+ region 124 (e.g., electrically floating) may be discharged to approximately 0.2V in order to turn the second bipolar transistor 14b to an "ON" state. By turning the second bipolar transistor 14b to an "ON" state, majority charge carriers may be injected into the P− region 122 in order to refresh a logic high (e.g., binary "1" data state) stored in the memory cell 12.

In the event that a logic low (e.g., binary "0" data state) is stored in the memory cell 12, the first bipolar transistor 14a may remain in an "OFF" state. For example, the junction between the N+ region 120 and the P− region 122 may not be forward biased or may be weakly forward biased and the junction between the P− region 122 and the N+ region 124 may or may not be forward biased or may be weakly forward biased so that the first bipolar transistor 14a may remain in an "OFF" state. When the first bipolar transistor 14a remains in an "OFF" state, the N+ region 124 (e.g., electrically floating) may not be discharged and may remain at a predetermined voltage potential (e.g., a precharge voltage potential). The second bipolar transistor 14b may remain in an "OFF" state when the N+ region is not discharged. When the second bipolar transistor 14b remains in an "OFF" state, majority charge carriers may not be injected into the P− region 122 in order to refresh a logic low (e.g., binary "0" data state) stored in the memory cell 12.

In an exemplary embodiment, when no charges or a small amount of charges are accumulated in the P− region 122 to indicate a logic low (e.g., binary "0" data state), the junction between the P− region 122 and the N+ region 124 is not forward biased and the N+ region 124 may not be discharged (e.g., maintaining a precharged voltage potential). The second bipolar transistor 14b may remain in an "OFF" state when the N+ region 124 is not discharged and the logic low (e.g., binary "0" data state) may be maintained in the memory cell 12. However, when a larger amount of charges are accumulated in the P− region 122 to indicate a logic low (e.g., binary "0" data state) is stored in the memory cell 12, the junction between the P− region 122 and the N+ region 124 may be weakly forward biased to deplete or discharge excessive charges stored in the P− region 122 to maintain a logic low (e.g., binary "0" data state) in the memory cell 12.

The fifth step of the refresh operation may include control signals configured to perform a write logic high (e.g., binary "1" data state) operation to memory cells 12 that may have voltage potential at the N+ region 124 discharged (e.g., to approximately 0.2V). The write logic high operation may include control signals configured to write a logic high (e.g., binary "1" data state) to the one or more selected memory cells 12. For example, a predetermined voltage potential may be applied to the word line (WL) 28 (e.g., capacitively coupled to the P− region 122). In an exemplary embodiment, a voltage potential applied to the word line (WL) 28 (e.g., capacitively coupled to the P− region 122) may be lowered to −1.0V from 0V.

Under such biasing, the majority charge carriers may continue to inject into the P− region 122 because the second bipolar transistor 14b which may be turned to an "ON" state in step four. The majority charge carriers may continue to inject into the P− region 122 even as the voltage potential applied by the word line (WL) 28 (e.g., capacitively coupled to the P− region 122) switches from 0V to −1.0V. For example, the junction between the N+ region 124 and the P+ region 126 may become forward biased and majority charge carriers (e.g., holes) may be injected into the P− region 122. The P− region 122 may accumulate/store an amount of charge carriers that may represent a predetermined voltage potential above the voltage potential at the N+ region 120. In an exemplary embodiment, the predetermined voltage potential may be 0.7V above the voltage potential at the N+ region 120. In the event that a logic low (e.g., binary "0" data state) is stored in the memory cell 12, the second bipolar transistor 14b may remain in an "OFF" state and the majority charge carriers may not be injected into the P− region 122. When the voltage potential applied by the word line (WL) 28 (e.g., capacitively coupled to the P− region 122) switches from 0V to −1.0V, the second bipolar transistor 14b may remain in the "OFF" state and the majority charge carriers may not be injected into the P− region 122. When majority charge carriers are not injected into the P− region 122, a logic low (e.g., binary "0" data state) may be maintained in the memory cell 12.

The sixth step of the refresh operation may include control signals to terminate the write logic high (e.g., binary "1" data state) operation. For example, coupling control signals may be applied to the one or more selection transistors (SELs) 514 and turn the one or more selection transistors (SELs) 514 to an "ON" state. The one or more turned "ON" selection transistors (SELs) 514 may couple a predetermined voltage potential to the one or more local bit lines (LCNs) 30 in order to turn the second bipolar transistor 14b to an "OFF" state and end the write logic high (e.g., binary "1" data state) in the selected memory cells 12. The predetermined voltage potential applied to the one or more local bit lines (LCNs) 30 to end the write logic high (e.g., binary "1" data state) operation may be determined based at least in part on the threshold voltage potential below which the majority charge carriers injected through the junction between the N+ region 124 and the P+ region 126 may be insignificant. For example, a predetermined voltage potential applied to the one or more local bit lines (LCNs) 30 may be approximately 0.7V.

As discussed above, the voltage potential applied to the word line (WL) 28 (e.g., capacitively coupled to the P− region 122) may be lowered to −1.0V from 0V and the voltage potential applied to the local bit lines (LCNs) 30 may be discharged to approximately 0.2V, while the voltage potential applied to the P+ region 126 via the carrier injection line (EP) 34 may be maintained at 1.0V. Under such biasing, the junction between the P− region 122 and the N+ region 124 may become forward biased so that a logic high (e.g., binary "1" data state) may be written to the P− region 122 (e.g., charge injection into the P− region 122 from the P+ region 126).

The seventh step of the refresh operation may also include control signals configured to perform a preparation to end operation. During the seventh step of the refresh operation, the voltage potentials applied to the memory cells 12 may adjust the amount of charge (e.g., an indication of data state) stored in the memory cells 12. In an exemplary embodiment, a voltage potential applied to the P+ region 126 via the carrier injection line (EP) 34 may be lowered to 0V. The P− region 122 which may be charged to approximately 0.7V above the voltage potential at the N+ region 124 during the write logic high (e.g., binary "1" data state) operation may be coupled low to approximately 0V by the voltage potential applied to the word line (WL) 28 (e.g., capacitively coupled to the P− region 122). The voltage potential applied to the word line (WL) 28 (e.g., capacitively coupled to the P− region 122) may be lowered to −1.8V and may determine an amount of charge (e.g., an indication of data state) stored in the P− region 122 of the memory cells 12. Also, a voltage potential applied to the N+ region 124 via the bit line (CN) 30 may be lowered to 0V to return to the hold operation in order to retain a data state (e.g., logic low (binary "0" data state) or logic high (binary "1" data state)).

At this point it should be noted that providing techniques for refreshing a semiconductor memory device in accordance with the present disclosure as described above typically involves the processing of input data and the generation of output data to some extent. This input data processing and output data generation may be implemented in hardware or software. For example, specific electronic components may be employed in a semiconductor memory device or similar or related circuitry for implementing the functions associated with refreshing a semiconductor memory device in accordance with the present disclosure as described above. Alternatively, one or more processors operating in accordance with instructions may implement the functions associated with refreshing a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for refreshing a semiconductor memory device comprising the steps of:
    applying a plurality of voltage potentials to a memory cell in an array of memory cells, wherein applying a plurality of voltage potentials to the memory cell comprises:
        applying a first voltage potential to a first region of the memory cell via a respective source line of the array;
        applying a second voltage potential to a second region of the memory cell via a respective local bit line and a respective selection transistor of the array;
        applying a third voltage potential to a respective word line of the array, wherein the word line is spaced apart from and capacitively to a body region of the memory cell that is electrically floating and disposed between the first region and the second region;
        applying a fourth voltage potential to a third region of the memory cell via a respective carrier injection line of the array; and
        maintaining the first voltage potential applied to the first region at a constant level via the respective source line during the refresh of the semiconductor memory device.

2. The method according to claim 1, wherein the respective local bit line is coupled to a multiplexer.

3. The method according to claim 2, wherein the multiplexer is coupled to a global bit line.

4. The method according to claim 2, wherein the multiplexer comprises at least one masking transistor coupled to the respective local bit line.

5. The method according to claim 4, wherein the multiplexer further comprises at least one hold transistor coupled to the respective local bit line.

6. The method according to claim 5, wherein the respective selection transistor is coupled to the at least one mask transistor and the at least one hold transistor.

7. The method according to claim 1, further comprising applying a selection control signal to the respective selection transistor to activate the respective selection transistor.

8. The method according to claim 7, further comprising increasing the second voltage potential applied to the respective local bit line from the second voltage potential applied to the respective local bit line during a hold operation via the activated respective selection transistor.

9. The method according to claim 1, further comprising increasing the fourth voltage potential applied to the respective carrier injection line from the fourth voltage potential applied to the respective carrier injection line during a hold operation.

10. The method according to claim 1, further comprising applying decoupling control signals to the respective selection transistor to deactivate the respective selection transistor.

11. The method according to claim 10, the respective local bit line is electrically floating after the respective selection transistor is deactivated.

12. The method according to claim 1, further comprising increasing the third voltage potential applied to the respective word line from the third voltage potential applied to the respective word line during a hold operation in order to perform a read operation.

13. The method according to claim 12, wherein the increase in the third voltage potential activates the memory cell to decrease the second voltage potential applied to the respective local bit line.

14. The method according to claim 1, further comprising decreasing the third voltage potential applied to the respective word line from the third voltage potential applied to the respective word line during a write logic low operation to perform a write logic high operation.

15. The method according to claim 14, wherein the third voltage potential applied to the respective word line during the write logic high operation is higher than the third voltage potential applied to the respective word line during a hold operation.

16. The method according to claim 1, further comprising applying a coupling control signals to the respective selection transistor to activate the respective selection transistor in order to perform an end to a write logic high operation.

17. The method according to claim 16, further comprising discharging the second voltage potential applied to the respective local bit line to forward bias a junction between the second region and the third region.

18. The method according to claim 1, further comprising decreasing the fourth voltage potential applied to the respective carrier injection line from the fourth voltage potential applied to the respective carrier injection line during a write logic high operation to perform a hold operation.

19. The method according to claim 1, further comprising decreasing the second voltage potential applied to the respective local bit line from the second voltage potential applied to the respective local bit line during a write logic high operation to perform a hold operation.

* * * * *